(12) United States Patent
Nakajima

(10) Patent No.: US 7,656,149 B2
(45) Date of Patent: Feb. 2, 2010

(54) CURRENT TRANSFORMER AND ELECTRIC ENERGY METER

(75) Inventor: Shin Nakajima, Tokyo (JP)

(73) Assignee: Metglas, Inc., Conway, SC (US)

( * ) Notice: Subject to any disclaimer, the term of this patent is extended or adjusted under 35 U.S.C. 154(b) by 0 days.

(21) Appl. No.: 12/222,667

(22) Filed: Aug. 13, 2008

(65) Prior Publication Data

US 2009/0021237 A1  Jan. 22, 2009

Related U.S. Application Data

(63) Continuation of application No. PCT/US2006/042960, filed on Nov. 2, 2006.

(60) Provisional application No. 60/734,789, filed on Nov. 9, 2005.

(51) Int. Cl.
*G01R 33/00* (2006.01)
*G01R 15/00* (2006.01)
*H01F 38/20* (2006.01)

(52) U.S. Cl. .............. 324/127; 324/117 R; 324/253; 702/57; 702/64; 336/173; 336/182

(58) Field of Classification Search ............. 324/117 R, 324/127, 253; 702/57, 64; 336/173, 182
See application file for complete search history.

(56) References Cited

U.S. PATENT DOCUMENTS

| | | | | |
|---|---|---|---|---|
| 4,274,052 A | * | 6/1981 | Gentry et al. | ........... 324/117 R |
| 4,847,554 A | | 7/1989 | Goodwin | |
| 6,563,411 B1 | * | 5/2003 | Otte et al. | ...................... 336/60 |
| 6,674,278 B1 | | 1/2004 | Uesugi | |
| 6,984,979 B1 | * | 1/2006 | Edel | ........................... 324/253 |
| 7,359,809 B2 | * | 4/2008 | Bruno | ........................ 702/64 |
| 2003/0080847 A1 | | 5/2003 | Radzelovage | |

FOREIGN PATENT DOCUMENTS

GB  2232493  12/1990

* cited by examiner

*Primary Examiner*—Ha Tran T Nguyen
*Assistant Examiner*—Emily Y Chan

(57) ABSTRACT

A current transformer detects a sine-wave alternating current having a maximum effective current value $I_{max}(A_{rms})$ and a frequency f(Hz) and a half-sine-wave rectified current having a maximum peak value $I_{peak}(A_{op})$ and a frequency f(Hz) in a primary winding, consisting of at least one magnetic core with one turn of primary winding and at least one multiple turns of secondary winding to which a detecting resistor is connected.

6 Claims, 3 Drawing Sheets

CURRENT TRANSFORMER AND ELECTRIC ENERGY METER

CROSS-REFERENCE TO RELATED APPLICATIONS

This application is a continuing application, filed under 35 U.S.C. §111(a), of International Application No. PCT/US2006/042960, filed Nov. 2, 2006, which claims the benefit of U.S. Provisional Application No. 60/734,789, filed 9 Nov. 2005, in the United States Patent and Trademark Office, the disclosures of which are incorporated herein by reference.

BACKGROUND OF THE INVENTION

1. Field of the Invention

This invention relates to a current transformer that detects a sine-wave alternating current and a half-sine-wave rectified current within a desired level of accuracy, and a static type electric energy meter in which a sine-wave alternating current and a half-sine-wave rectified current are input, and incorporated with such a current transformer.

2. Background of the Invention

Electric energy meters are used to calculate the electric power consumption of electric machines and instruments in homes and industries. Both electromechanical type electric energy meters and static type electric energy meters are commonly used. Static type electric energy meters, however, have come into wide use with the advancement of technology concerning electronics. In a static type electric energy meter, it is necessary to detect both an alternating load voltage value and an alternating load current value.

A current transformer for use in a static type electric energy meter includes a magnetic core provided with one turn of primary winding, through which an alternating load current is passed, and hundreds turns or thousands turns of secondary winding, to which a detecting resistor is connected in parallel. The resistor represents the resistance of the secondary winding. The measuring accuracy in a current transformer is evaluated by the amplitude error F(I) and the phase error $\phi$. Accordingly, the values should be lower than a determined value.

The amplitude error F(I) is determined by the following equation:

$$F(I) = -\frac{R_{Cu} + R_b}{\omega L_s} \sin\delta, \text{ where} \qquad (1)$$

$R_{Cu}$ is the resistance of the resistor, which represents the resistance of the secondary winding ($\Omega$),
$R_b$ is the resistance of the detecting resistor ($\Omega$),
$\delta$ is the loss angle of magnetic core (rad),
$\omega = 2\pi f$ is the angular frequency (rad/s), and
$L_s$ is the inductance of the secondary winding (H).

The inductance $L_s$ of the secondary winding is determined by the following equation:

$$L_s = \frac{\mu_r \mu_0 A_e N_s^2}{l_e} \text{ (H), where} \qquad (2)$$

$\mu_r$ is the incremental relative permeability of the magnetic core,
$\mu_0$ is the permeability of a vacuum, $4\pi \times 10^{-7}$ (H/m),
$A_e$ is the effective cross section of the magnetic core (m²),
$N_s$ is the number of turns of the secondary winding, and
$l_e$ is the mean magnetic path length of the magnetic core (m).

From equation (1) and equation (2) shown above, the following equation (3) can be derived:

$$F(I) = -\frac{(R_{Cu} + R_b) l_e}{\omega \mu_r \mu_0 N_s^2 A_e} \sin\delta. \qquad (3)$$

The phase error $\phi$ is determined by the following equation:

$$\phi = \tan^{-1}\left(\frac{R_{Cu} + R_b}{\omega L_s} \cos\delta\right) \text{(rad)}. \qquad (4)$$

Using equation (2) and equation (4), the following equation can be obtained:

$$\phi = \tan^{-1}\left(\frac{(R_{Cu} + R_b) l_e}{\omega \mu_r \mu_0 N_s^2 A_e} \cos\delta\right) \text{(rad)}. \qquad (5)$$

As shown by equations (3) and (5), it is effective to use a magnetic core provided with a high value of incremental relative permeability, $\mu_r$, in order to reduce the amplitude error F(I) and the phase error $\phi$. From this perspective, it is advantageous to use a magnetic core made of 80% nickel permalloy or a magnetic core made of nano-crystalline alloy provided with an incremental relative permeability of more than 10,000, in order to produce excellent current transformers. These current transformers can be widely used in a static type electric energy meters for industrial use according to the standard IEC 62053-22. As the load current value is great as 100 $A_{rms}$ or more in industrial instruments, only a small amount of completely zero-symmetrical sine-wave alternating current reduced by an external special transformer is input into such a static type electric energy meter.

A current transformer incorporating a magnetic core made of 80% nickel permalloy or nano-crystalline alloy having an incremental relative permeability of more than 10,000, however, is not suitable for a static type electric energy meter into which a load current is directly input, for domestic use, or for relatively small loaded industrial use. In these uses, a zero-asymmetrical alternating load current including a direct current component, which is caused by half-wave rectifier circuits or phase controlling circuits used in current electronic devices or instruments, is directly input into the electric energy meter. A current transformer incorporating a magnetic core material having a high incremental relative permeability is designed to accept only zero-symmetrical sine-wave alternating current. When a zero-asymmetrical alternating input current is input into the primary winding of such a current transformer, which contains a direct current component, the input of the zero-asymmetrical alternating input current causes a saturation of the magnetic core and falsifies the current detection.

The measuring of the accuracy range and the testing method to measure a half-sine-wave rectified current are set forth in the representative standard IEC 62053-21, 8.2 and Annex/A concerning the static type electric energy meter, into which a load current is directly input, for domestic use and relatively small loaded industrial use. The standard IEC 62053-21 requires for the static type electric energy meter, which has a performance specification to measure a sine-wave alternating current having a maximum effective current value $I_{max}(A_{rms})$ within the range of accuracy defined by this IEC standard, to measure a half-sine-wave rectified current having an effective current value $I_{max}\cdot 2^{0.5}$ ($A_{rms}$). Thus, a wave height $2^{0.5}\cdot I_{max}(A_{op})$ falls within the range of accuracy defined by this IEC standard. As a half-sine-wave rectified current contains a direct current component having a value of $1/\pi$ times the wave height, the value of the direct current component in a half-wave rectified waveform current having an effective current value Imax$\cdot 2^{0.5}$ ($A_{rms}$) or a wave height $2^{0.5}\cdot I_{max}(A_{op})$ is $(2^{0.5}/\pi)\cdot I_{max}(A_{DC})$. A current transformer incorporating a Co-based amorphous core, which satisfies the desired accuracy for an alternating current measurement in a static type electric energy meter, even if the current containing such a big value of direct current component is input into the primary winding, is proposed in U.S. Pat. No. 6,563,411B1. Also, current transformers incorporating toroidal cores made of the Co-based amorphous alloy VITROVAC® (Vacuumschmelze GmbH & Co. KG, Hanau, Germany) 6030F or 6150F are presented by Vacuumschmelze GmbH & Co. KG (hereafter abridged as VAC).

The core proposed in U.S. Pat. No. 6,563,411 B1, or made of Co-based alloys VITROVAC® 6030F or 6150F, presented by VAC, when used for a static type electric energy meter for residential use or relatively small loaded industrial use, satisfies the desired accuracy for electric energy measurement in these static type electric energy meters when a sine-wave alternating current and a half-sine-wave rectified current, respectively, are input. However, when using the core proposed in U.S. Pat. No. 6,563,411 B1, VITROVAC® 6030F, or 6150F, the size of the core and current transformer required to achieve the desired electric specification for these static type electric energy meters is too large.

For example, six kinds of current transformers for a static type electric energy meter are shown in Table 2 of "Current Transformers for Electronic Watthour Meters" (http://www-.vacuumschmelze.de/dynamic//docroot/medialib/documents/broschueren/kbbrosch/Pb-cteng.pdf). The five kinds of current transformers have a rated maximum effective current value $I_{max}(A_{rms})$ of 20 $A_{rms}$, 40 $A_{rms}$, 60 $A_{rms}$, 100 $A_{rms}$, and 120 $A_{rms}$, respectively, with respect to a sine-wave alternating current according to the standard IEC 61036, which is comparable to the new standard IEC 62053-21. As shown in Table 2, the five kinds of current transformers each have a rated maximum peak value $2^{0.5}\cdot I_{max}(A_{op})$ of 36 $A_{op}$, 72 $A_{op}$, 80 $A_{op}$, 113 $A_{op}$, and 158 $A_{op}$, respectively, with respect to a half-sine-wave rectified current as shown in the same table.

The specifications of the magnetic cores used in these current transformers are set forth in "Cores for Current Transformers for Electronic Energy Meter" (http://www.vacuumschmeize.de/dynamic//en/home/products/coresampinductivecomponents/applications/cores/coresforcurrenttransformersforelectronicenergymeter.php). Based on these specifications, it is understood that a toroidal core made of the Co-based amorphous alloy VITROVAC® 6030F is used in the current transformer having a rated maximum effective current value $I_{max}(A_{rms})$ of 20 $A_{rms}$ with respect to the sine-wave alternating current, and the toroidal cores made of Co-based amorphous alloy VITROVAC® 6150F are used in other current transformers.

According to the IEC standard, current transformers having rated maximum effective current values $I_{max}(A_{rms})$ of 20 $A_{rms}$, 40 $A_{rms}$, 60 $A_{rms}$, 100 $A_{rms}$, and 120 $A_{rms}$, respectively, with respect to the sine-wave alternating current should have rated maximum peak values $2^{0.5}\cdot I_{max}(A_{op})$ of 28.3 $A_{op}$, 56.6 $A_{op}$, 84.9 $A_{op}$, 141 $A_{op}$ and 170 $A_{op}$, respectively, with respect to a half-sine-wave rectified current. Thus, strictly speaking, the current transformers having rated maximum effective current values $I_{max}(A_{rms})$ of 60 $A_{rms}$, 100 $A_{rms}$, and 120 $A_{rms}$ with respect to the sine-wave alternating current are not appropriate for application in a static type electric energy meter, as determined by the rated maximum effective current value $I_{max}(A_{rms})$ and designed under the standard IEC 62053-21. Only the current transformers having rated maximum effective current values $I_{max}(A_{rms})$ of 20 $A_{rms}$ and 40 $A_{rms}$, respectively, with respect to a sine-wave alternating current may be used for a static type electric energy meter determined by the rated maximum effective current value $I_{max}(A_{rms})$ and designed under the standard IEC 62053-21.

For example, in order to apply a current transformer selected from those described above for a static type electric energy meter having a rated maximum effective current value $I_{max}(A_{rms})$ of 60 $A_{rms}$ with respect to the sine-wave alternating current defined in the IEC standard, the current transformer having a rated maximum effective current value $I_{max}(A_{rms})$ of 100 $A_{rms}$ with respect to the sine-wave alternating current must be used. Additionally, none of the current transformers described above for a static type electric energy meter having a rated maximum effective current value $I_{max}(A_{rms})$ of 120 $A_{rms}$ determined by the IEC standard with respect to the sine-wave alternating current as determined by the IEC standard can be selected. Moreover, the current transformers described above have rated maximum effective current values $I_{max}(A_{rms})$ of 20 $A_{rms}$ and 40 $A_{rms}$, respectively, with respect to the sine-wave alternating current is excess performance, because they have maximum peak values of $2^{0.5}\cdot I_{max}(A_{op})$ of 36 $A_{op}$ and 72 $A_{op}$, respectively, concerning a half-sine-wave rectified current. According to the IEC standard, however, these values should be 28.3 $A_{op}$ and 56.6 $A_{op}$, respectively. Thus, size of these current transformers should be reduced in comparison to the sizes described.

As mentioned above, it is desirable to present electromagnetic specifications and ways of design of magnetic cores and current transformers well fit for the IEC standard IEC62053-21 for static type electric energy meters. Although U.S. Pat. No. 6,563,411B1 explains some qualitative requirements for a current transformer and a magnetic core to be incorporated in a static type electric energy meter defined under the IEC (IEC 1036, which is the same as IEC 61036, the old standard corresponding to IEC 62053-21), it is not enough to present quantitative guidelines to design a magnetic core and a current transformer to be applied for a static type electric energy meter determined by the IEC standard IEC 1036.

SUMMARY OF THE INVENTION

Additional aspects and/or advantages of the invention will be set forth in part in the description which follows and, in part, will be apparent from the description, or may be learned by practice of the invention.

According to an embodiment of the present invention, a small size current transformer can measure the current value within a desired range of accuracy, even if it contains a sine-wave alternating current and/or a half-sine-wave rectified current. The power consumption can be measured, within a desired range of accuracy, by a static type electric energy meter where both a sine-wave alternating sine current and a half-sine-wave rectified current is input into a small size current transformer.

To solve the above described problems, a current transformer is provided to detect a sine-wave alternating current having a maximum effective current value $I_{max}(A_{rms})$ and a frequency f(Hz) and a half-sine-wave rectified current having a maximum peak value $I_{peak}(A_{op})$ and a frequency f(Hz) in a primary winding, consisting of at least one magnetic core with one turn of primary winding and at multiple turns of secondary winding to which a detecting resistor is connected. A current transformer according to an embodiment of the present invention is characterized in that the effective cross section $A_e$ of the magnetic core is determined as $$A_e \geq A_{e(min)}^* \ (m^2), \text{ where}$$

$$A_{e(min)}^* = \frac{I_{max} \cdot (R_{Cu} + R_b)}{4.44 \cdot f \cdot N_s^2 \cdot B_s} \ (m^2), \text{ and}$$

$B_s$ is the saturation magnetic flux density of the magnetic core (T),
$N_s$ is the number of turns of the secondary winding,
$R_{Cu}$ is the resistance of the second winding (Ω),
$R_b$ is the resistance of the detecting resistor (Ω),
and $$A_e \geq A_{e(min)}^{**} (m^2), \text{ where}$$

$$A_{e(min)}^{**} = \frac{(R_{Cu} + R_b)(D_{i(min)} + 1.5 \times 10^{-3})}{2f\mu_r\mu_0 N_s^2 \tan\phi} \ (m^2), \text{ and}$$

$$D_{i(min)} = a\sqrt{I_{max}} + b \ (m),$$

$$0.75 \times 10^{-3} \leq a \leq 1.25 \times 10^{-3} \ (m/A^{0.5}), \text{ and}$$

$$8.0 \times 10^{-3} \leq b \leq 12.0 \times 10^{-3} \ (m), \text{ where}$$

$D_{i(min)}$ is the minimum value of inner diameter of the magnetic core (m),
$\mu_r$ is the incremental relative permeability of the magnetic core,
$\mu_0$ is the permeability of a vacuum, $4\pi \times 10^{-7}$ (H/m), and
$\phi$ is the phase error of current transformer (rad), and the mean magnetic path length $l_e$ satisfies $$l_e \geq l_{e(min)}^* \ (m), \text{ where}$$

$$l_{e(min)}^* = \frac{I_{peak}}{\pi\left\{H_s - \frac{N_p \cdot I_{peak}(R_{Cu} + R_b)}{2\pi\mu_r\mu_0 N_s^2 \cdot A_e}\right\}\left\{\frac{T}{2}\left[\frac{\cos\left(\frac{2\pi T_{Vs0}}{T}\right) - }{\cos\left(\frac{2\pi[(T/2) - T_{Vs0}]}{T}\right)}\right] + \right\}} \ (m)$$

$$H_s = \frac{B_s}{\mu_r\mu_0} \ (A/m), \text{ and}$$

$$T_{Vs0} = \frac{T}{2\pi}\sin^{-1}\left(\frac{1}{\pi}\right)(s); \text{ where}$$

$T = 1/f$: period(s)

and $$l_e \geq l_{e(min)}^{**}(m), \text{ where}$$

$$l_{e(min)}^{**} = \pi(D_{i(min)} + 1.5 \times 10^{-3}) \ (m).$$

A current transformer according to an embodiment of the present invention can detect a current value within a predetermined range of accuracy, even if the current contains a sine-wave alternating current and a half-sine-wave rectified current. Moreover, according to an embodiment of the invention, the maximum peak value $I_{peak}(A_{op})$ of a half-sine-wave rectified current in the primary winding is equal to the value $2^{0.5} \cdot I_{max}(A_{op})$ obtained by half-wave rectification of a sine-wave alternating current having a maximum effective current value $I_{max}(A_{rms})$ and a frequency f(Hz) in the primary winding. This ensures that the current transformer is well fit for a relatively small size of static type electric energy meter to accept a direct input of the load current to be used in homes and industries, determined by the representative standard IEC 62053-21.

According to an embodiment of the invention, the effective cross section $A_e$ of the magnetic core satisfies $$A_e \geq cA_{e(min)}^*(m^2)$$

and $$A_e \geq cA_{e(min)}^{**}(m^2), \text{ where}$$

$$1.0 \leq c \leq 1.25,$$

and the mean magnetic path length $l_e$ satisfies $$l_e \geq dl_{e(min)}^*(m)$$

and $$l_e \geq dl_{e(min)}^{**}(m), \text{ where}$$

$$1.0 \leq d \leq 1.25.$$

Under such conditions, the size of the current transformer can be minimized without decreasing the measuring accuracy. Thus, static type electric energy meters capable of measuring power consumption within the desired rage of accuracy and accepting direct input of a load current including a sine-wave alternating current and a half-sine-wave rectified current can be incorporated in a small size of current transformer as described above.

BRIEF DESCRIPTION OF THE DRAWINGS

These and/or other aspects and advantages of embodiments of the invention will become apparent and more readily appreciated from the following description of the embodiments, taken in conjunction with the accompanying drawings of which.

DETAILED DESCRIPTION

Figure 1:
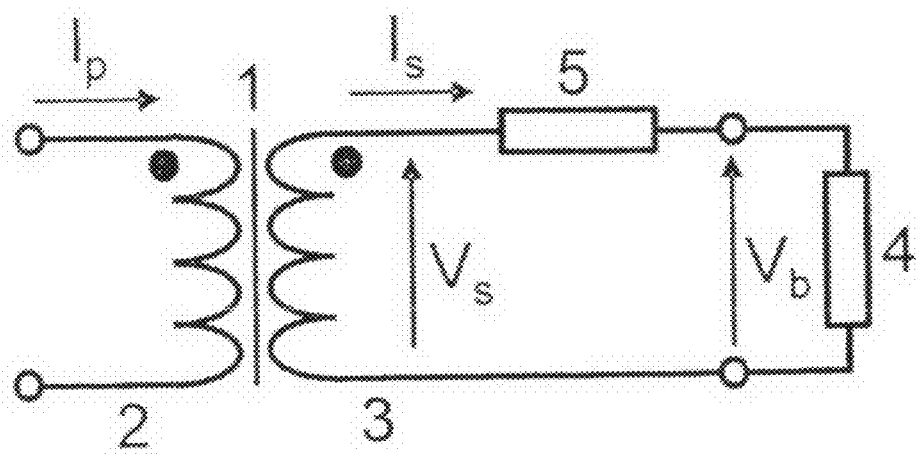
FIG. 1 is a block diagram showing a circuit of a current transformer according to an embodiment of the present invention.

Reference will now be made in detail to the embodiments of the present invention, examples of which are illustrated in the accompanying drawings, wherein like reference numerals refer to the like elements throughout. The embodiments are described below to explain the present invention by referring to the figures.

An embodiment of the present invention relates to a current transformer by which current value can be measured within a desired range of accuracy, even if the current contains a sine-wave alternating current and a half-sine-wave rectified current according to the representative standard IEC 62053-21, which defines a relatively small size of static type electric energy meter for domestic use and industrial use in which the load current is input directly.

The operation of the current transformer shown in FIG. 1 is explained as follows, in a case that a zero-symmetrical sine-wave alternating current having an effective current $I_{p(rms)}$ ($A_{rms}$) and a frequency f is flowing in the one turn of primary winding 2.

Here we assume that the B-H loop of the magnetic core 1 is linear and the excitation current is negligibly small compared with the sine-wave alternating current having an effective current value $I_{p(rms)}(A_{rms})$ in the primary winding 2. If the magnetic core 1 is not saturated, the following equation satisfies the law of equal ampere-turn.

$$I_{p(rms)} = N_S \cdot I_{s(rms)}(A) \quad (25)$$

$N_s$: turns of the secondary winding 3

So a zero-symmetrical sine-wave alternating current having an effective current value $I_{s(rms)}$ determined by the equation (25) flows in the secondary winding 3.

On the other hand, the effective value $V_{s(rms)}$ of voltage $V_s$ induced in the secondary winding in such a case is defined by the following equation:

$$V_{s(rms)} = I_{s(rms)} \cdot (R_{Cu} + R_b)(V) \quad (26)$$

$R_{Cu}$: winding resistance 5 of the secondary winding 3($\Omega$)

$R_b$: resistance of the detecting resistor 4($\Omega$).

The following equation can be derived by the equations (25) and (26):

$$V_{s(rms)} = \frac{I_{p(rms)} \cdot (R_{Cu} + R_b)}{N_s} \quad (V). \quad (27)$$

Figure 2:
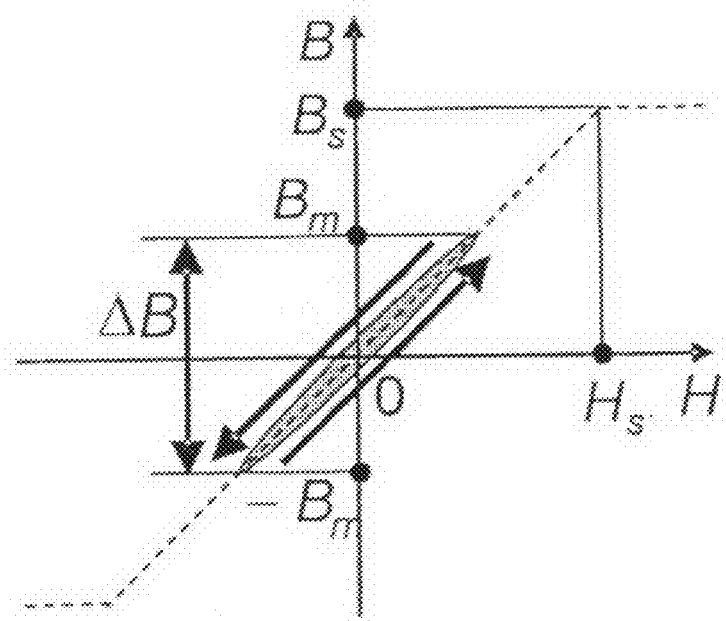
FIG. 2 is a conceptual drawing showing the dynamic B-H loop of non-saturated magnetic core 1 where zero-symmetrical sine-wave alternating current is input into primary winding 2 of a current transformer according to an embodiment of the present invention.

FIG. 2 shows a conceptual drawing of a dynamic B-H loop of a non-saturated magnetic core 1, where zero-symmetrical sine-wave alternating current is input into the primary winding 2 of a current transformer, where $$V_{s(rms)} = 4.44 \cdot f \cdot N_s \cdot A \cdot B_m(V), \text{ where} \quad (28)$$

$A_e$: the effective cross section of the magnetic core 1 (m²), and $B_m$: the operating magnetic flux density of the magnetic core 1 (T).

Thus, based on equation (28), the effective cross section $A_e$ of the magnetic core 1 is determined by the following equation:

$$A_e = \frac{I_{p(rms)} \cdot (R_{Cu} + R_b)}{4.44 \cdot f \cdot N_s^2 \cdot B_m} \ (m^2). \quad (29)$$

Equation (29) is obtained when the magnetic core 1 is not saturated. Under this condition, the effective cross section $A_e$ of the magnetic core 1 should be determined by the following conditions, when the maximum effective current value of the sine-wave alternating current flowing in the primary winding 2 is $I_{max}(A_{rms})$:

$$A_e \geq A^*_{e(min)} \ (m^2) \quad (6)$$

$$A^*_e = \frac{I_{max} \cdot (R_{Cu} + R_b)}{4.44 \cdot f \cdot N_s^2 \cdot B_s} \ (m^2). \quad (7)$$

The minimum value $D_{i(min)}$(m) of the inner diameter of the magnetic core 1 is determined by the line diameter of the primary winding 2, a winding space for the secondary winding 3, a space for isolation test between the primary winding 2 and the secondary winding 3, and a necessary space for a case and insulation coating for the magnetic core 1. Although the inner diameter of the magnetic core should allow a space for the one turn of primary winding 2 determined by the line diameter of the primary winding 2 and a space for the winding, it was determined that it is practically sufficient to define the diameter $D_{i(min)}$ as being equal to 0.75 times to 1.25 times the root value of the maximum effective current value $I_{max}$ ($A_{rms}$) of the sine-wave alternating current. However, in order to have the space for winding of the secondary winding 3, a space for isolation between the primary winding and the secondary winding, and a space for case or insulating coating layer considering the thickness of the resin case, the thickness of the resin coating, the thickness of insulating case or the thickness of insulating coating layer, it was determined that the necessary space is practically sufficient if we keep it as a value between 8 mm to 12 mm.

Because of the above stated restrictions, the minimum value $D_{i(min)}$ of the magnetic core 1 should satisfy the following equation:

$$D_{i(min)} = a \sqrt{\sqrt{I_{max}}} + b(m), \text{ where} \quad (10)$$

$$0.75 \times 10^{-3} \leq a \leq 1.25 \times 10^{-3} (m/A^{0.5}), \text{ and} \quad (11)$$

$$8.0 \times 10^{-3} \leq b \leq 12.0 \times 10^{-3} (m). \quad (12)$$

Using the above defined minimum value $D_{i(min)}$ of the magnetic core and the practically minimum diameter 1.5 mm considering the minimum thickness of the core which can be manufactured in factories and reliable, the minimum value $l_e^{**}$ of the mean magnetic path length of the magnetic core can be determined by the following equation:

$$l_e^{**} = \pi(D_{i(min)} + 1.5 \times 10^{-3})(m) \quad (18)$$

Based on equation (5), the phase error of the current transformer can be determined by the equation:

$$\tan\phi = \frac{(R_{Cu} + R_b)l_e}{\omega \mu_r \mu_0 N_s^2 A_e} \cos\delta. \quad (30)$$

As $\cos \delta$ in equation (30) is about 1 for a magnetic core to be used in a current transformer, the following expression can be obtained:

$$\tan\phi \cong \frac{(R_{Cu}+R_b)l_e}{\omega\mu_r\mu_0 N_s^2 A_e}. \tag{31}$$

In order to restrict the phase error $\phi$ to a required range of value, the effective cross section $A_e^{}$ of magnetic core 1** is determined by the following equation:

$$A_e^{**} \cong \frac{(R_{Cu}+R_b)l_e}{\omega\mu_r\mu_0 N_s^2 \tan\phi}(m^2). \tag{32}$$

The following equation can then be derived from equations (18) and (32):

$$A_e^{**} \cong \frac{(R_{Cu}+R_b)(D_{i(min)}+1.5\times 10^{-3})}{2f\mu_r\mu_0 N_s^2 \tan\phi}(m^2). \tag{33}$$

The following conditions to determine the effective cross section $A_e^{}$ of magnetic core 1** can be obtained on the basis of the practical requirements to manufacture a current transformer and to reduce the phase error than a predetermined value to restrict the measuring accuracy in a desired rage of value:

$$A_e \geq A_{e(min)}^{**}(m^2), \tag{8}$$

$$A_{e(min)}^{**} = \frac{(R_{Cu}+R_b)(D_{i(min)}+1.5\times 10^{-3})}{2f\mu_r\mu_0 N_s^2 \tan\phi}(m^2), \tag{9}$$

and $$D_{i(min)} = a\sqrt{I_{max}}+b(m), \tag{10}$$

where $$0.75\times 10^{-3} \leq a \leq 1.25\times 10^{-3}(m/A^{0.5}), \tag{11}$$

and $$8.0\times 10^{-3} \leq b \leq 12.0\times 10^{-3}(m). \tag{12}$$

The operation of the current transformer shown in FIG. 1 in a case that a half-sine-wave rectified current having a peak value $I_{p(op)}$, obtained by half-wave rectification of a sine-wave alternating current having a frequency f flows in the one turn of primary winding 2 is described as follows. The B-H loop is presumed to be linear and the exciting current is negligibly small compared with the half-sine-wave rectified current having the peak current value $I_{p(op)}$ in primary winding 2.

The instantaneous value of the half-sine-wave rectified current having a peak value $I_{p(op)}$, can be represented as a time t dependent function $i_{(t)}$ by a Fourier expansion of the current, as in the following:

$$i_{(t)} = \frac{I_{p(op)}}{\pi}+\frac{I_{p(op)}}{2}\sin\omega t - \frac{I_{p(op)}}{\pi}\left(\frac{2}{1\cdot 3}\cos 2\omega t + \frac{2}{3\cdot 5}\cos 4\omega t + \frac{2}{5\cdot 7}\cos 6\omega t + \dots\right)(A). \tag{34}$$

Figure 3:
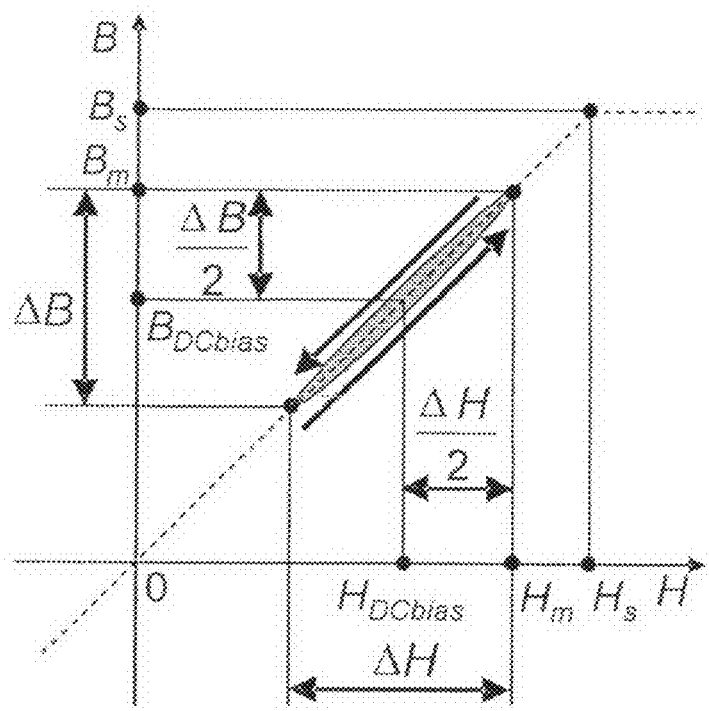
FIG. 3 is a conceptual drawing showing the dynamic B-H loop of non-saturated magnetic core 1 where half-sine-wave rectified current is input into primary winding 2 of a current transformer according to an embodiment of the present invention.

As understood from equation (34), a half-sine-wave rectified current having a peak value $I_{p(op)}$ contains a direct current component $I_{p(op)}/\pi$. Magnetic core 1 is directly biased by a direct magnetic field $H_{DCbias}$, which is defined by equation (35) below and other alternating current components represented in equation (34) are superimposed. This operation is shown conceptually in FIG. 3.

$$H_{DCbias} = \frac{I_{p(op)}}{\pi 1_e}(A/m) \tag{35}$$

The direct magnetic flux density $B_{DCbias}$ corresponding to the direct magnetic field $H_{DCbias}$ can be represented by the following equation:

$$B_{DCbias} = \mu_r\mu_0 H_{DCbias} = \frac{\mu_r\mu_0 I_{p(op)}}{\pi 1_e}(T). \tag{36}$$

In this case the maximum magnetic field $H_m$ and the maximum magnetic flux density $B_m$ can be described in the following equations:

$$H_m = H_{DCbias}+\frac{\Delta H}{2} = \frac{I_{max}}{\pi 1_e}+\frac{\Delta H}{2}(A/m), \tag{37}$$

and $$B_m = B_{DCbias}+\frac{\Delta B}{2} = \frac{\mu_r\mu_0 I_{max}}{\pi 1_e}+\frac{\Delta B}{2}(T). \tag{38}$$

Therefore, the following equation derived from equation (37) should be satisfied without saturating magnetic core 1:

$$1_e \geq \frac{I_{max}}{\pi[H_s - (\Delta H/2)]}(m). \tag{39}$$

Figure 4:
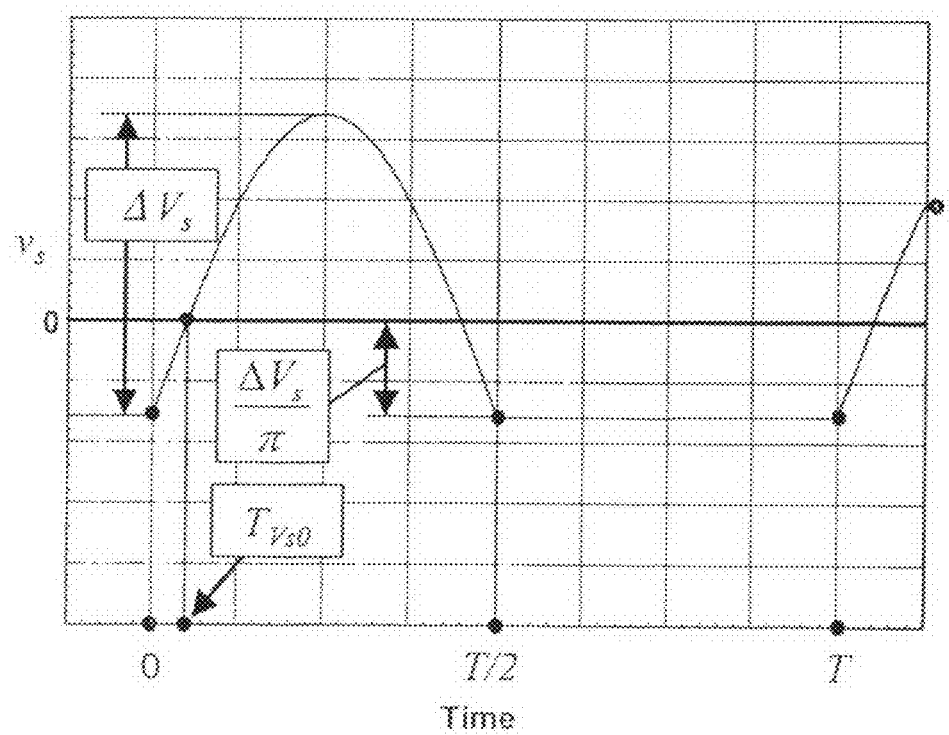
FIG. 4 is a conceptual drawing showing the waveform of the terminal voltage at secondary winding 3, when half-sine-wave rectified current is input into the primary winding 2 of a current transformer according to an embodiment of the present invention, and magnetic core 2 is not saturated.

The waveform of the terminal voltage $V_s$ of secondary winding 3 is illustrated conceptually in FIG. 4, when that a half-sine-wave rectified current having a peak value $I_{p(op)}$ flows in the primary winding of the current transformer and the magnetic core 1 is not saturated. Here the terminal voltage variation $\Delta V_s$ shown in FIG. 4 can be represented by the following equation depending on the current variation $\Delta I_s$ in secondary winding 3:

$$\Delta V_s = \Delta I_s(R_{Cu}+R_b)(V). \tag{40}$$

This current variation $\Delta I_s$ can be defined, according to the law of equal ampere-turn, by the following equation:

$$\Delta I_s = \frac{I_{p(op)}}{N_s}(A). \tag{41}$$

Using equations (40) and (41), the equation for the variation of the terminal voltage $\Delta Vs$ can be defined as follows:

$$\Delta V_s = \frac{I_{p(op)}(R_{Cu}+R_b)}{N_s}(V). \tag{42}$$

The terminal voltage in secondary winding 3 can be represented by a time (t) dependent function $v_s(t)$ as follows, in the time range of 0 to T/2 shown in FIG. 4:

$$v_s(t) = \Delta V_s \sin\left(\frac{2\pi}{T}t\right) - \frac{\Delta V_s}{\pi} \quad (43)$$

$$= \frac{N_p \cdot I_{max}(R_{Cu} + R_b)}{N_s}\left[\sin\left(\frac{2\pi}{T}t\right) - \frac{1}{\pi}\right](V),$$

and in the time range of T/2 to T, $$v_s(t) = -\frac{\Delta V_s}{\pi} \quad (44)$$

$$= -\frac{N_p \cdot I_{max}(R_{Cu} + R_b)}{\pi N_s}(V).$$

The terminal voltage in secondary winding 3 at the time $T_{Vs0}$ illustrated in FIG. 4 can be derived from equation (43):

$$v_s(T_{Vs0}) = \Delta V_s \sin\left(\frac{2\pi}{T}T_{Vs0}\right) - \frac{\Delta V_s}{\pi} = 0(V). \quad (45)$$

The following equation can be obtained from equation (45):

$$\Delta V_s \sin\left(\frac{2\pi}{T}T_{Vs0}\right) = \frac{\Delta V_s}{\pi}(V). \quad (46)$$

The time $T_{Vs0}$ when the voltage $v_s(t)$ becomes zero, as shown in FIG. 4, can be determined by the following equation:

$$T_{Vs0} = \frac{T}{2\pi}\sin^{-1}\left(\frac{1}{\pi}\right)(s). \quad (15)$$

Figure 5:
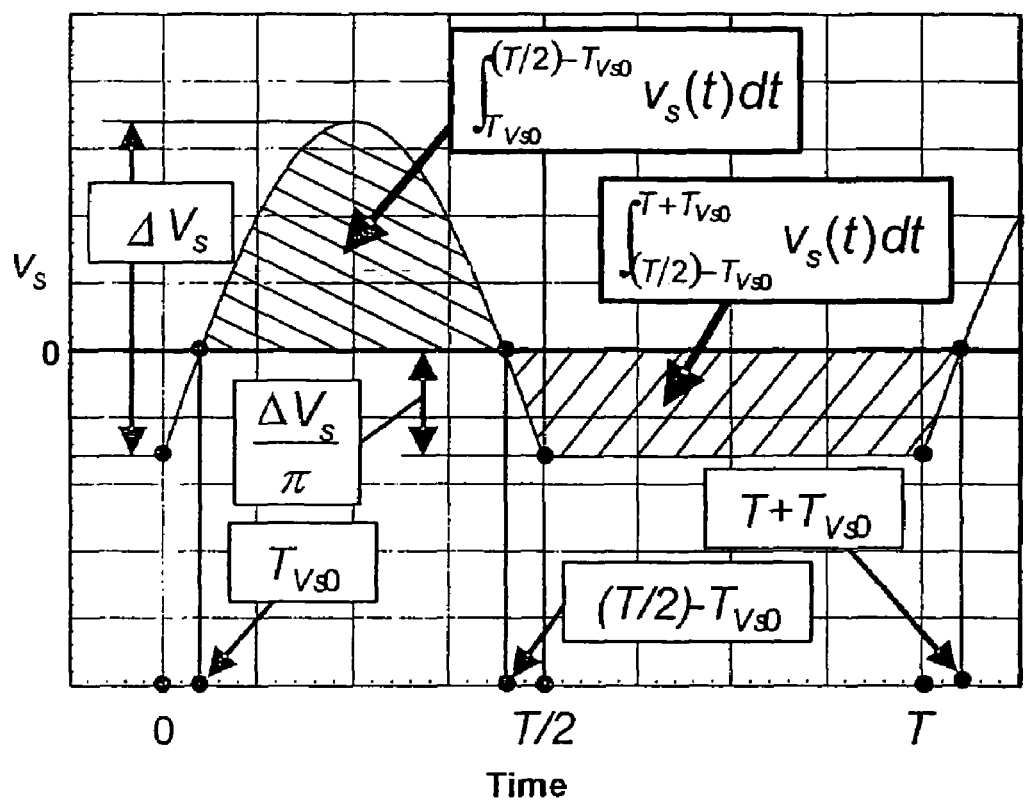
FIG. 5 is a conceptual drawing showing, in detail, the waveform of the terminal voltage at secondary winding 3, when half-sine-wave rectified current is input into primary winding 2 of a current transformer according to an embodiment of the present invention, and magnetic core 2 is not saturated.

As shown in the conceptual waveform of $v_s$ illustrated in FIG. 5, $v_s(t)$ is positive in the time range between $T_{Vs0}$ and $(T/2)-T_{Vs0}$, and negative in the time range between $(T/2)-T_{Vs0to}$ and $T+T_{Vs0}$.

As the variation of the magnetic flux density $\Delta B$ should be equal in these two time periods, the following equation should be satisfied:

$$\Delta B = \frac{\int_{T_{Vs0}}^{(T/2)-T_{Vs0}} v_s(t)\,dt}{N_s \cdot A_e} = \frac{\int_{(T/2)-T_{Vs0}}^{T+T_{Vs0}} v_s(t)\,dt}{N_s \cdot A_e}(T). \quad (47)$$

The following equation is obtained by solving equation (47):

$$\Delta B = \frac{\int_{T_{Vs0}}^{(T/2)-T_{Vs0}} v_s(t)\,dt}{N_s \cdot A_e} \quad (48)$$

$$= \frac{I_{p(op)}(R_{Cu} + R_b)}{N_s^2 \cdot A_e}$$

$$\left[\int_{T_{Vs0}}^{(T/2)-T_{Vs0}} \sin\left(\frac{2\pi}{T}t\right)dt - \int_{T_{Vs0}}^{(T/2)-T_{Vs0}} \frac{1}{\pi}dt\right]$$

-continued $$= \frac{I_{p(op)}(R_{Cu} + R_b)}{N_s^2 \cdot A_e}$$

$$\left\{-\frac{T}{2\pi}\left[\cos\left(\frac{2\pi}{T}t\right)\right]_{T_{Vs0}}^{(T/2)-T_{Vs0}} - \left[\frac{t}{\pi}\right]_{T_{Vs0}}^{(T/2)-T_{Vs0}}\right\}$$

$$= \frac{I_{p(op)}(R_{Cu} + R_b)}{\pi N_s^2 \cdot A_e}$$

$$\left\{\frac{T}{2}\left[\cos\left(\frac{2\pi T_{Vs0}}{T}\right) - \cos\left(\frac{2\pi[(T/2)-T_{Vs0}]}{T}\right)\right] + 2T_{Vs0} - (T/2)\right\}(T).$$

The variation of the magnetic field $\Delta H$ corresponding to the variation of the magnetic flux density $\Delta B$ can be determined by the following equation.

$$\Delta H = \frac{I_{p(op)}(R_{Cu} + R_b)}{\pi\mu_r\mu_0 N_s^2 \cdot A_e}\left\{\frac{T}{2}\left[\begin{array}{c}\cos\left(\frac{2\pi T_{Vs0}}{T}\right) - \\ \cos\left(\frac{2\pi[(T/2)-T_{Vs0}]}{T}\right)\end{array}\right] + 2T_{Vs0} - (T/2)\right\}(A/m) \quad (49)$$

Using equations (37) and (49), the maximum magnetic field $H_m$ is determined according to the following equation:

$$H_m = H_{DCbias} + \frac{\Delta H}{2} \quad (50)$$

$$= \frac{I_{p(op)}}{\pi l_e} + \frac{I_{p(op)}(R_{Cu} + R_b)}{2\pi\mu_r\mu_0 N_s^2 \cdot A_e}$$

$$\left\{\frac{T}{2}\left[\cos\left(\frac{2\pi T_{Vs0}}{T}\right) - \cos\left(\frac{2\pi[(T/2)-T_{Vs0}]}{T}\right)\right] + 2T_{Vs0} - (T/2)\right\}$$

$$= \frac{I_{p(op)}}{\pi}\left\{\frac{1}{l_e} + \frac{(R_{Cu} + R_b)}{2\pi\mu_r\mu_0 N_s^2 \cdot A_e}\right.$$

$$\left\{\frac{T}{2}\left[\cos\left(\frac{2\pi T_{Vs0}}{T}\right) - \cos\left(\frac{2\pi[(T/2)-T_{Vs0}]}{T}\right)\right] + 2T_{Vs0} - (T/2)\right\}\right\}$$

(A/m).

Accordingly, the limiting conditions in which we can measure the current when a half-sine-wave rectified current having a peak value $I_{p(op)}$ flows in primary winding 2 of the current transformer without saturating magnetic core 1 can be determined by the following equation:

$$H_s = \quad (51)$$

$$\frac{I_{peak}}{\pi}\left\{\frac{1}{l_e} + \frac{(R_{Cu} + R_b)}{2\mu_r\mu_0 N_s^2 \cdot A_e}\left\{\frac{T}{2}\left[\begin{array}{c}\cos\left(\frac{2\pi T_{Vs0}}{T}\right) - \\ \cos\left(\frac{2\pi[(T/2)-T_{Vs0}]}{T}\right)\end{array}\right] + 2T_{Vs0} - (T/2)\right\}\right\}(A/m),$$

where $H_s$ is the saturating magnetic field determined by the equation:

$$H_s = \frac{B_s}{\mu_r \mu_0} \text{ (A/m)}. \tag{15}$$

When the saturation magnetic flux density $H_s$, the effective cross section $A_e$, and the mean magnetic path length $l_e$ of magnetic core 1 are given, the maximum value $I_{peak}$ of the half-sine-wave rectified current to be measured without saturating magnetic core 1 can be expressed by the following equation as derived from the equation (51):

$$I_{peak} = \frac{\pi H_s}{\frac{1}{l_e} + \frac{(R_{Cu}+R_b)}{2\mu_r\mu_0 N_s^2 \cdot A_e}\left\{\frac{T}{2}\left[\begin{array}{c}\cos\left(\frac{2\pi T_{Vs0}}{T}\right) - \\ \cos\left(\frac{2\pi[(T/2)-T_{Vs0}]}{T}\right)\end{array}\right] + 2T_{Vs0} - (T/2)\right\}} \text{ (A)}. \tag{52}$$

Moreover, the minimum value $I_{e(min)}$ of the mean magnetic path length required to measure the half-sine-wave rectified current having the maximum peak value $I_{peak}$ without saturating magnetic core 1 can be expressed by the following equation:

$$I_{e(min)}^* = \frac{I_{peak}}{\pi\left\{H_s - \frac{I_{peak}(R_{Cu}+R_b)}{2\pi\mu_r\mu_0 N_s^2 \cdot A_e}\right\}\left\{\frac{T}{2}\left[\begin{array}{c}\cos\left(\frac{2\pi T_{Vs0}}{T}\right) - \\ \cos\left(\frac{2\pi[(T/2)-T_{Vs0}]}{T}\right)\end{array}\right] + 2T_{Vs0} - (T/2)\right\}} \text{ (m)}. \tag{14}$$

A current transformer to detect a sine-wave alternating current and also a half-sine-wave rectified current, as specified in Table 1, according to the above stated analytical results was investigated. A magnetic core 1 made of Fe-base amorphous metal having the magnetic characteristics shown in Table 2 was used.

TABLE 1

| $I_{max}$ (A) | $I_{peak}$ (A) | f (Hz) | $N_p$ | $N_s$ | F (I) | $\phi$ (rad) | $R_{cu}$ ($\Omega$) | $R_b$ ($\Omega$) |
|---|---|---|---|---|---|---|---|---|
| 60 | 85 | 50 | 1 | 2,500 | ≦0.0004 | ≦0.070 | 55 | 12.5 |

TABLE 2

| $B_s$(T) | $\mu_r$* | $H_s$**(A/m) |
|---|---|---|
| 1.6 | 2,500 | 516 |

*measured at 50 Hz, $B_m$ = 0.2 T
**$H_s = B_s/(\mu_r\mu_0)$

The minimum effective cross section $A_{e(min)}^*$ of magnetic core 1 can be expressed by the following equation, as derived from equation (7) above, in order to measure the maximum value $I_{max}$ of the sine-wave alternating current without saturating the magnetic core 1:

$$A_e^* = \frac{I_{max} \cdot (R_{Cu}+R_b)}{4.44 \cdot f \cdot N_s^2 \cdot B_s} \tag{53}$$

$$= \frac{60 \times (55+12.5)}{4.44 \times 50 \times 2{,}500^2 \times 1.6}$$

$$= 1.55 \text{ mm}^2.$$

The effective cross section $A_{e(min)}$ shall satisfy the following expression, considering equations (7) and (53):

$$A_e \geq A_{e(min)}^* = 1.55 \text{ mm}^2. \tag{54}$$

The minimum diameter $D_{i(min)}$ of magnetic core 1 shall satisfy the following equation, as derived from the equation (10):

$$D_{i(min)} = a\sqrt{I_m} + b = a\sqrt{60} + b = 7.75a + b(m). \tag{55}$$

We can obtain the following value for the minimum diameter $D_{i(min)}$, using the medium value $1.0 \times 10^{-3}$ of a in the equation (11) and the medium value $10 \times 10^{-3}$ of b in the equation (12):

$$D_{i(min)} = 7.75a + b = 7.75 \times 1.0 \times 10^{-3} + 10 \times 10^{-3} = 17.7 \times 10^{-3} m. \tag{56}$$

The minimum cross section $A_{e(min)}^{}$ of magnetic core 1** practically required can be obtained by substituting $D_{i(min)}$ (=$17.7 \times 10^{-3}$ m) and other constant numerals from Tables 1 and 2 into equation (9):

$$A_{e(min)}^{**} = \frac{(R_{Cu}+R_b)(D_{i(min)}+1.5\times 10^{-3})}{2f\mu_r\mu_0 N_s^2 \tan\phi} \tag{57}$$

$$= \frac{(55+12.5)\times(17.7\times 10^{-3}+1.5\times 10^{-3})}{2\times 50\times 2{,}500\times 4\pi\times 10^{-7}\times 2{,}500^2\times \tan 0.070}$$

$$= 9.41 \text{ mm}^2.$$

The effective cross section shall satisfy the following condition as derived from equations (8) and (58):

$$A_e \geq A_{e(min)}^{**} = 9.41 \text{ mm}^2. \tag{58}$$

Thus, the effective cross section of magnetic core 1 is 9.41 mm², which is the minimum value to satisfy both equation (54) and equation (58).

The minimum value of the effective cross section $I_{e(min)}^*$ of magnetic core 1 necessary to measure the maximum peak value $I_{peak}$ of the half-sine-wave rectified current without saturating magnetic core 1 can be derived as follows. The time $T_{Vso}$ when the terminal voltage of secondary winding 3 becomes zero can be determined by the following equation, as derived from equation (16):

$$T_{Vs0} = \frac{T}{2\pi}\sin^{-1}\left(\frac{1}{\pi}\right) = \frac{20\times 10^{-3}}{2\pi}\sin^{-1}\left(\frac{1}{\pi}\right) = 1.03 \text{ ms}. \tag{59}$$

By substituting the above $T_{Vso}$=1.03 ms and other constant numerals from Table 1 and Table 2 into equation (14), the minimum value of the mean magnetic path length can be expressed by the following equation:

$$l_{e(min)}^{*} = \frac{I_{peak}}{\pi \left\{ H_s - \frac{I_{peak}(R_{Cu}+R_b)}{2\pi\mu_r\mu_0 N_s^2 \cdot A_e} \right\} \left\{ \frac{T}{2} \left[ \frac{\cos\left(\frac{2\pi T_{Vs0}}{T}\right) - \cos\left(\frac{2\pi[(T/2)-T_{Vs0}]}{T}\right)}{2T_{Vs0}-(T/2)} \right] + \right\}} \quad (60)$$

$$= \frac{85}{\pi \left\{ 516 - \frac{85\times(55+12.5)}{2\pi\times 2{,}500\times 4\pi\times 10^{-7}\times 9.41\times 10^{-6}} \right\} \left\{ 10\times 10^{-3} \left[ \frac{\cos\frac{2\pi\times 1.03\times 10^{-3}}{20\times 10^{-3}} - \cos\left(\frac{2\pi\left[\frac{10\times 10^{-3}-}{1.03\times 10^{-3}}\right]}{20\times 10^{-3}}\right)}{2\times 1.03\times 10^{-3} - 10\times 10^{-3}} \right] + \right\}}$$

$$= 58.6 \text{ mm.}$$

Therefore, the mean magnetic path length $l_e^*$ of magnetic core 1 shall satisfy the following condition as derived from equations (13) and (60):

$$l_e \geq l_{e(min)}^* = 58.6 \text{ mm.} \quad (61)$$

The minimum value of the mean magnetic path length $l_{e(min)}^{**}$ described in equation (18) can be modified according to the following, by using $D_{i(min)} = 17.7 \times 10^{-3}$ m in equation (56):

$$l_e^{**} = \pi(D_{i(min)} + 1.5\times 10^{-3}) = \pi(17.7\times 10^{-3} + 1.5\times 10^{-3}) = 60.3 \text{ mm.} \quad (62)$$

Therefore, the mean magnetic path length $l_e^*$ of magnetic core 1 shall satisfy the following expression, as derived from equation (17) and equation (62):

$$l_e \geq l_{e(min)}^{**} = 60.3 \text{ mm.} \quad (63)$$

Under the above stated conditions, the mean magnetic path length $l_e$ was determined to be 60.3 mm, which is the minimum value to satisfy equation (61) and equation (63).

The specifications of magnetic core 1 designed by the above stated analysis are shown in Table 3.

TABLE 3

| $A_e$ (mm2) | $L_e$ (mm) | $B_s$ (T) | $\mu_r$ | $H_s$ (A/m) |
|---|---|---|---|---|
| 9.41 | 60.3 | 1.6 | 2,500 | 516 |

*measured at 50 Hz, $B_m = 0.2$ T
**$H_s = B_s/(\mu_r\mu_0)$

It has been confirmed that the current transformer shown in FIG. 1, provided with magnetic core 1 and having the dimensions and magnetic characteristics described in Table 3, one turn of primary winding 2, 2,500 turns of secondary winding having 55Ω of resistance, and 12.5Ω of detecting resistance, satisfies the specifications shown in Table 1.

The upper limits practically permitted for effective cross section $A_{e(min)}$, defined by equations (6) and (8), and mean magnetic path length $l_e$, defined by equations (13) and (17), have been investigated. The investigation confirmed that practically reliable current transformers can be produced for use at a temperature of 120° C. for a ten year period, if the upper limit is defined as 1.25 times the values of effective cross section $A_{e(min)}$ and the mean magnetic path length $l_e$, defined by equations (6) and (8) and equations (13) and (17), respectively.

Moreover, it can be confirmed that the size of a current transformer can be minimized to fit well to the standard IEC 62053-21, if the peak value obtained by equation (14) is equal to the value $2^{0.5} \cdot I_{max}(A_{op})$, derived by rectification of a sine-wave alternating current having a maximum effective current $I_{max}(A_{rms})$ and a frequency f(Hz).

As understood from the above explanations, the current transformer in the example is advantageous to detect both a sine-wave alternating current and a half-sine-wave rectified current and to be incorporated in a small size static type electric energy meter, in which both a sine-wave alternating current and a half-sine-wave rectified current are directly input.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A current transformer to detect a sine-wave alternating current having a maximum effective current value $I_{max}(A_{rms})$ and a frequency f(Hz), and a half-sine-wave rectified current having a maximum peak value $I_{peak}(A_{op})$ and a frequency f(Hz) in a primary winding, comprising:

at least one magnetic core having one turn of primary winding and multiple turns of secondary winding to which a detecting resistor is connected in parallel, and having an effective cross section $A_e$ of the magnetic core being determined by $$A_e \geq A_{e(min)}^* \text{ (m}^2)$$

$$A_{e(min)}^* = \frac{I_{max} \cdot (R_{Cu} + R_b)}{4.44 \cdot f \cdot N_s^2 \cdot B_s} \text{ (m}^2), \text{ where}$$

$B_s$ is a saturation magnetic flux density of the magnetic core (T),
$N_s$ is a number of turns of the secondary winding,
$R_{Cu}$ is a resistance of the secondary winding (Ω),
$R_b$ is a resistance of the detecting resistor (Ω), and $$A_e \geq A^{**}_{e(min)} \text{ (m}^2\text{)}$$

$$A^{**}_{e(min)} = \frac{(R_{Cu} + R_b)(D_{i(min)} + 1.5 \times 10^{-3})}{2f\mu_r\mu_0 N_s^2 \tan\phi} \text{ (m}^2\text{)}$$

$$D_{i(min)} = a\sqrt{I_{max}} + b \text{ (m)}$$

$$0.75 \times 10^{-3} \leq a \leq 1.25 \times 10^{-3} \text{ (m/A}^{0.5}\text{)}$$

$$8.0 \times 10^{-3} \leq b \leq 12.0 \times 10^{-3} \text{ (m), where}$$

$D_{i(min)}$ is a minimum value of an inner diameter of the magnetic core (m), $\mu_r$ is an incremental relative permeability of the magnetic core, $\mu_0$ is a permeability of a vacuum, $4\pi \times 10^{-7}$ (H/m), and $\phi$ is a phase error of current transformer (rad), and the mean magnetic path length $l_e$ satisfies $$l_e \geq l^*_{e(min)} \text{ (m)}$$

$$l^*_{e(min)} = \frac{I_{peak}}{\pi\left\{H_s - \frac{N_p \cdot I_{peak}(R_{Cu} + R_b)}{2\pi\mu_r\mu_0 N_s^2 \cdot A_e}\right\}\left\{\frac{T}{2}\left[\cos\left(\frac{2\pi T_{Vs0}}{T}\right) - \cos\left(\frac{2\pi[(T/2) - T_{Vs0}]}{T}\right)\right] + 2T_{Vs0} - (T/2)\right\}} \text{ (m)}$$

$$H_s = \frac{B_s}{\mu_r\mu_0} \text{ (A/m)}$$

$$T_{Vs0} = \frac{T}{2\pi}\sin^{-1}\left(\frac{1}{\pi}\right) \text{ (s), where}$$

$T = 1/f$: period (s), and $$l_e \geq l^{**}_{e(min)} \text{ (m)}$$

$$l^{**}_{e(min)} = \pi(D_{i(min)} + 1.5 \times 10^{-3}) \text{ (m)}.$$

2. A current transformer according to claim 1, wherein the maximum peak value $I_{peak}(A_{op})$ of the half-sine-wave rectified current in the primary winding is equal to the value $2^{0.5} \cdot I_{max}(A_{op})$ obtained by half-wave rectification of the sine-wave alternating current having a maximum effective current value $I_{max}(A_{rms})$ and a frequency f(Hz) in the primary winding.

3. A current transformer according to claim 1 or claim 2, wherein the effective cross section $A_e$ of the magnetic core satisfies $$A_e \geq cA_{e(min)}^* (m^2)$$

and $$A_e \geq cA_{e(min)}^{**} (m^2), \text{ where}$$

$1.0 \leq c \leq 1.25$, and the mean magnetic path length $l_e$ satisfies $$l_e \geq dl_{e(min)}^* (m)$$

and $$l_e \geq dl_{e(min)}^{**} (m), \text{ where}$$

$1.0 \leq d \leq 1.25$.

4. A static type electric energy meter in which a sine-wave alternating current and a half-sine-wave rectified current are input, and incorporated with a current transformer according to claim 1.

5. A static type electric energy meter in which a sine-wave alternating current and a half-sine-wave rectified current are input, and incorporated with a current transformer according to claim 2.

6. A static type electric energy meter in which a sine-wave alternating current and a half-sine-wave rectified current are input, and incorporated with a current transformer according to claim 3.

* * * * *

UNITED STATES PATENT AND TRADEMARK OFFICE
CERTIFICATE OF CORRECTION

PATENT NO. : 7,656,149 B2
APPLICATION NO. : 12/222667
DATED : February 2, 2010
INVENTOR(S) : Shin Nakajima It is certified that error appears in the above-identified patent and that said Letters Patent is hereby corrected as shown below:

Column 18, Line 23, change "$l_c$" to --$l_e$--.

Signed and Sealed this

First Day of June, 2010

David J. Kappos
*Director of the United States Patent and Trademark Office*